US009721856B2

(12) United States Patent
Erickson et al.

(10) Patent No.: US 9,721,856 B2
(45) Date of Patent: Aug. 1, 2017

(54) IMPLEMENTING RESISTANCE DEFECT PERFORMANCE MITIGATION USING TEST SIGNATURE DIRECTED SELF HEATING AND INCREASED VOLTAGE

(71) Applicant: International Business Machines Corporation, Armonk, NY (US)

(72) Inventors: Karl R. Erickson, Rochester, MN (US); Phil C. Paone, Rochester, MN (US); David P. Paulsen, Inver Grove Heights, MN (US); John E. Sheets, II, Zumbrota, MN (US); Gregory J. Uhlmann, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 215 days.

(21) Appl. No.: 14/750,471

(22) Filed: Jun. 25, 2015

(65) Prior Publication Data
US 2016/0379898 A1    Dec. 29, 2016

(51) Int. Cl.
*H01L 21/66* (2006.01)
*G05B 19/418* (2006.01)
*G01R 31/28* (2006.01)
*G01R 31/317* (2006.01)

(52) U.S. Cl.
CPC .......... *H01L 22/22* (2013.01); *G01R 31/2868* (2013.01); *G01R 31/2894* (2013.01); *G01R 31/31707* (2013.01); *G05B 19/41875* (2013.01); *G05B 2219/40361* (2013.01)

(58) Field of Classification Search
CPC .............. H01L 22/22; G01R 31/31707; G01R 31/2894; G01R 31/2868; G05B 19/41875; G05B 2219/40361
See application file for complete search history.

(56) References Cited

U.S. PATENT DOCUMENTS

| 4,727,234 | A  | 2/1988  | Oprysko        |
|-----------|----|---------|----------------|
| 4,994,154 | A  | 2/1991  | Chen et al.    |
| 5,141,602 | A  | 8/1992  | Chen et al.    |
| 5,781,557 | A  | 7/1998  | Greason et al. |
| 5,818,239 | A  | 10/1998 | Scaman         |
| 5,883,437 | A  | 3/1999  | Maruyama et al.|
| 6,035,526 | A  | 3/2000  | Saruta et al.  |
| 6,472,889 | B1 | 10/2002 | Bahns et al.   |
| 6,545,500 | B1 | 4/2003  | Field          |

(Continued)

OTHER PUBLICATIONS

Partridge et al., "Repair of Circuits by Laser Seeding and Constriction Induced Plating", IEEE Transactions on Components, Hybrids, and Manufacturing Technology, vol. 15, No. 2, pp. 252-257 (1992).

(Continued)

*Primary Examiner* — Naum B Levin
(74) *Attorney, Agent, or Firm* — Joan Pennington (57) ABSTRACT

A method and system are provided for implementing resistive defect performance mitigation for integrated circuits. A test is generated for identifying resistive defects. A first self heating repair process is performed for repairing resistive defects. Testing is performed to identify a mitigated resistive defect and a functional integrated circuit. Responsive to identifying a resistive defect not being mitigated and a functional integrated circuit, a second repair process is performed, then testing is performed again.

11 Claims, 5 Drawing Sheets

(56) References Cited

U.S. PATENT DOCUMENTS

| | | |
|---|---|---|
| 6,566,888 B1 | 5/2003 | Bruce et al. |
| 6,713,686 B2 | 3/2004 | Becker et al. |
| 7,045,786 B2 | 5/2006 | Mandelis et al. |
| 7,062,399 B1 | 6/2006 | Bruce et al. |
| 7,109,721 B2 | 9/2006 | Maurer et al. |
| 7,274,194 B1 | 9/2007 | Anderson et al. |
| 7,629,559 B2 | 12/2009 | Desai et al. |
| 7,786,436 B1 | 8/2010 | Lundquist et al. |
| 8,184,227 B2 | 5/2012 | Huang et al. |
| 8,891,293 B2 | 11/2014 | Du et al. |
| 9,104,806 B2 * | 8/2015 | Shann ................. G06F 11/3664 |
| 9,140,947 B2 | 9/2015 | Zhang et al. |
| 9,583,403 B2 * | 2/2017 | Erickson ................. H01L 22/22 |
| 2003/0174241 A1 | 9/2003 | Silverbrook |
| 2012/0327708 A1 | 12/2012 | Du et al. |

OTHER PUBLICATIONS

Cole et al., "Resistive interconnection localization", Proceedings of the 9th International IEEE Symposium on the Physical and Failure Analysis of Integrated Circuits, (IPFA 2002), pp. 15-21 (2002).
Appendix P—List of IBM Patents or Patent Applications Treated as Related—Sep. 19, 2015.

* cited by examiner

IMPLEMENTING RESISTANCE DEFECT PERFORMANCE MITIGATION USING TEST SIGNATURE DIRECTED SELF HEATING AND INCREASED VOLTAGE

FIELD OF THE INVENTION

The present invention relates generally to the data processing field, and more particularly, relates to a method and system for implementing resistance defect performance mitigation for integrated circuits using test signature directed self heating and increased voltage.

DESCRIPTION OF THE RELATED ART

New semiconductor technologies afford enhanced densities, performance and energy efficiencies but are often plagued with low yields and/or performance issues. Functional yield issues and more often performance issues, particularly early in the development time line are major impediments to system development schedules.

Performance of early user semiconductor hardware is often gated by defects that add significant resistance, often in contacts to diffusions and/or vias between metal planes.

A need exists for an effective method and system for implementing enhanced manufacturability, yield and performance of early development samples of integrated circuits by identifying and repairing resistive defects before the sample integrated circuits are supplied to system developers.

SUMMARY OF THE INVENTION

Principal aspects of the present invention are to provide a method and system for implementing resistive defect performance mitigation for integrated circuits using test signature directed self heating and increased voltage. Other important aspects of the present invention are to provide such method, and system substantially without negative effects and that overcome many of the disadvantages of prior art arrangements.

In brief, a method and system are provided for implementing resistance defect performance mitigation for integrated circuits. A test is generated for identifying resistive defects. A first self heating repair process is performed for repairing resistive defects. Testing is performed to identify a mitigated resistive defect and a functional integrated circuit. Responsive to identifying a resistive defect not being mitigated and a functional integrated circuit, a second repair process is performed, and testing is performed again.

In accordance with features of the invention, the first self heating repair process includes repeatedly switching a signal on the circuit path containing the resistive defect at a selected frequency and a selected voltage, such as at or perhaps slightly above a maximum frequency at which the integrated circuit will function for a significant duration, for example on the order of microseconds allowing millions of switches.

In accordance with features of the invention, the repeated switching nominally is done at an elevated voltage to enhance the amount of localized heating and stressing of any residual dielectric films in the resistive defect.

In accordance with features of the invention, repairing resistive defects includes for example, repairing resistive connections in contacts and vias, or a high resistance open defect present in an internally embedded interconnect.

In accordance with features of the invention, an appropriate voltage for use of the integrated circuit is applied to the defect node, and testing is performed to identify a mitigated resistive defect and a functional integrated circuit.

In accordance with features of the invention, the second repair process includes for example, a laser utilized to enhance the local heating, or providing incremental voltage steps and repeating until a maximum voltage is reached.

In accordance with features of the invention, responsive to identifying a resistive defect being mitigated and a functional integrated circuit being identified, a successful repair is identified. Responsive to identifying a resistive defect being mitigated or not mitigated, when a functional integrated circuit is not identified, the integrated circuit sample under test is discarded.

BRIEF DESCRIPTION OF THE DRAWINGS

The present invention together with the above and other objects and advantages may best be understood from the following detailed description of the preferred embodiments of the invention illustrated in the drawings, wherein.

DETAILED DESCRIPTION OF THE PREFERRED EMBODIMENTS

In the following detailed description of embodiments of the invention, reference is made to the accompanying drawings, which illustrate example embodiments by which the invention may be practiced. It is to be understood that other embodiments may be utilized and structural changes may be made without departing from the scope of the invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

In accordance with features of the invention, a method and system are provided for implementing resistance defect performance mitigation for integrated circuits using test signature directed self heating and increased voltage in accordance with preferred embodiments.

Figure 1:
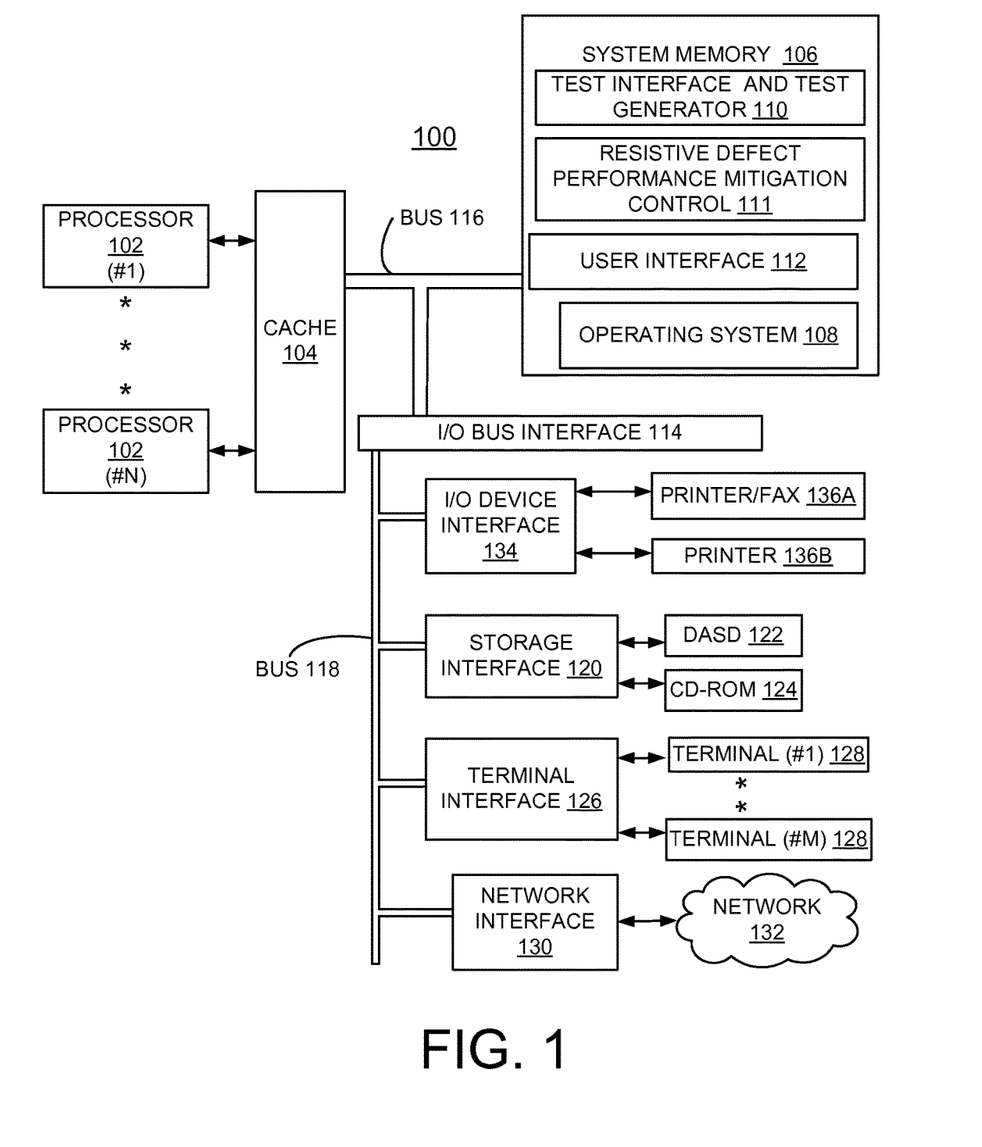
FIG. 1 is a block diagram of an example computer system for implementing resistance defect performance mitigation for integrated circuits using test signature directed self heating and increased voltage in accordance with preferred embodiments.

Having reference now to the drawings, in FIG. 1, there is shown an example computer system generally designated by the reference character 100 for implementing resistance defect performance mitigation for integrated circuits using test signature directed self heating and increased voltage in accordance with preferred embodiments. Computer system 100 includes one or more processors 102 or general-purpose programmable central processing units (CPUs) 102, #1-N. As shown, computer system 100 includes multiple processors 102 typical of a relatively large system; however, system 100 can include a single CPU 102. Computer system 100 includes a cache memory 104 connected to each processor 102.

Computer system 100 includes a system memory 106, an operating system 108, a test interface and test generator 110 and a resistive defect performance mitigation control 111 in accordance with preferred embodiments of the invention and a user interface 112.

In accordance with features of the invention, the test interface and test generator 110 and the resistive defect performance mitigation control 111 are provided with an integrated circuit sample under test for implementing resistance defect performance mitigation for integrated circuits. Functional and performance testing of early user semiconductor hardware often focuses on identifying systemic failures and the underlying frequency limitations. This invention further identifies integrated circuit samples having substandard performance due to one or more resistive defects and defines a methodology to repair defects, recovering at least some integrated circuit samples otherwise unusable for high performance development applications.

In accordance with features of the invention, the test interface and test generator 110 and the resistive defect performance mitigation control 111 implement techniques for identifying slow paths, such as cycle limiting logical or storage element path. Such techniques have advanced utilizing built in self test as well as application programs over the last several technology cycles. Conventionally once a slow path has been identified, the offending semiconductor is normally relegated to the scrap pile or is utilized in some limited application where full performance is not required.

Methods of the invention mitigate resistive defect utilizing self heating, optionally including another repair process using an external source, such as local laser heating during wafer performance testing. The resistive defects are most often related to openings, an undersized via or contacts and/or via or contacts with some residual insulating film. Undersized contacts and/or vias that lead to resistive defects and excessive delay frequently limit the ability of a semiconductor fabricator to provide development hardware at the performance targets in a timely manner. Defects are common as new lithography masks are brought online in fabrication, particularly those masks used before sufficient process window experimentation can be performed to optimize a given reticle and lithography exposing tool to a particular design. The most common defects that arise from this relative process/design interaction immaturity are resistive, but not completely open connections in contacts and vias. These defects are most frequently caused by an undersized opening in the dielectric down to the underlying conductive surface, for example, due to print or etch issues. Note these undersized opening are often accompanied by a reduction in volume of the electromigration mitigating liner films, often TiN.

In accordance with features of the invention, the test interface and test generator 110 and the resistive defect performance mitigation control 111 repair resistive defects via a novel self heating and/or external point heating technique after defects are identified utilizing traditional means, nominally by application based maximum frequency limiting path analysis. Once a defective connection is identified, repeatedly switching a signal to this defective connection at or perhaps slightly above the maximum frequency at which it will function at the selected voltage for a significant duration, such as on the order of microseconds allowing millions of switches in an attempt to mitigate the resistive defect. This repeated switching is nominally done at elevated voltage to enhance the amount of localized heating and stressing of any residual dielectric films in the connecting area. Also a laser optionally is utilized to enhance the local heating. Note all other circuits can be power gated, clock gated or at least functionally gated to avoid introducing new defects to previously fully functional semiconductor circuits. Typical defects that can be mitigated with this technique include oxidized liner issues, undersized contact or via systemic issues. Physical failure analysis on one die can often indicate the exact failing contact on another die, aiding this recovery technique.

In accordance with features of the invention, the test interface and test generator 110 and the resistive defect performance mitigation control 111, for example, provide elevated temperature, bias and switching coupled with the unintentionally thin liner film associated with an undersized or malformed dielectric opening that allows small amount of conductor (normally copper) to migrate from one conductor plane to another greatly reducing the resistance in the connection and allowing enhanced performance after this technique is utilized. The success rate of this new repair process typically is far less than 100% but is desirable with a success rate, for example, as low as 10%.

System memory 106 is a random-access semiconductor memory for storing data, including programs. System memory 106 is comprised of, for example, a dynamic random access memory (DRAM), a synchronous direct random access memory (SDRAM), a current double data rate (DDRx) SDRAM, non-volatile memory, optical storage, and other storage devices.

I/O bus interface 114, and buses 116, 118 provide communication paths among the various system components. Bus 116 is a processor/memory bus, often referred to as front-side bus, providing a data communication path for transferring data among CPUs 102 and caches 104, system memory 106 and I/O bus interface unit 114. I/O bus interface 114 is further coupled to system I/O bus 118 for transferring data to and from various I/O units. As shown, computer system 100 includes a storage interface 120 coupled to storage devices, such as, a direct access storage device (DASD) 122, and a CD-ROM 124. Computer system 100 includes a terminal interface 126 coupled to a plurality of terminals 128, #1-M, a network interface 130 coupled to a network 132, such as the Internet, local area or other networks, and a I/O device interface 134 coupled to I/O devices, such as a first printer/fax 136A, and a second printer 136B.

I/O bus interface 114 communicates with multiple I/O interface units 120, 126, 130, 134, which are also known as I/O processors (IOPs) or I/O adapters (IOAs), through system I/O bus 116. System I/O bus 116 is, for example, an industry standard PCI bus, or other appropriate bus technology.

Computer system 100 is shown in simplified form sufficient for understanding the present invention. It should be understood that the present invention is not limited to the illustrated arrangement of computer system 100.

Figure 2A:
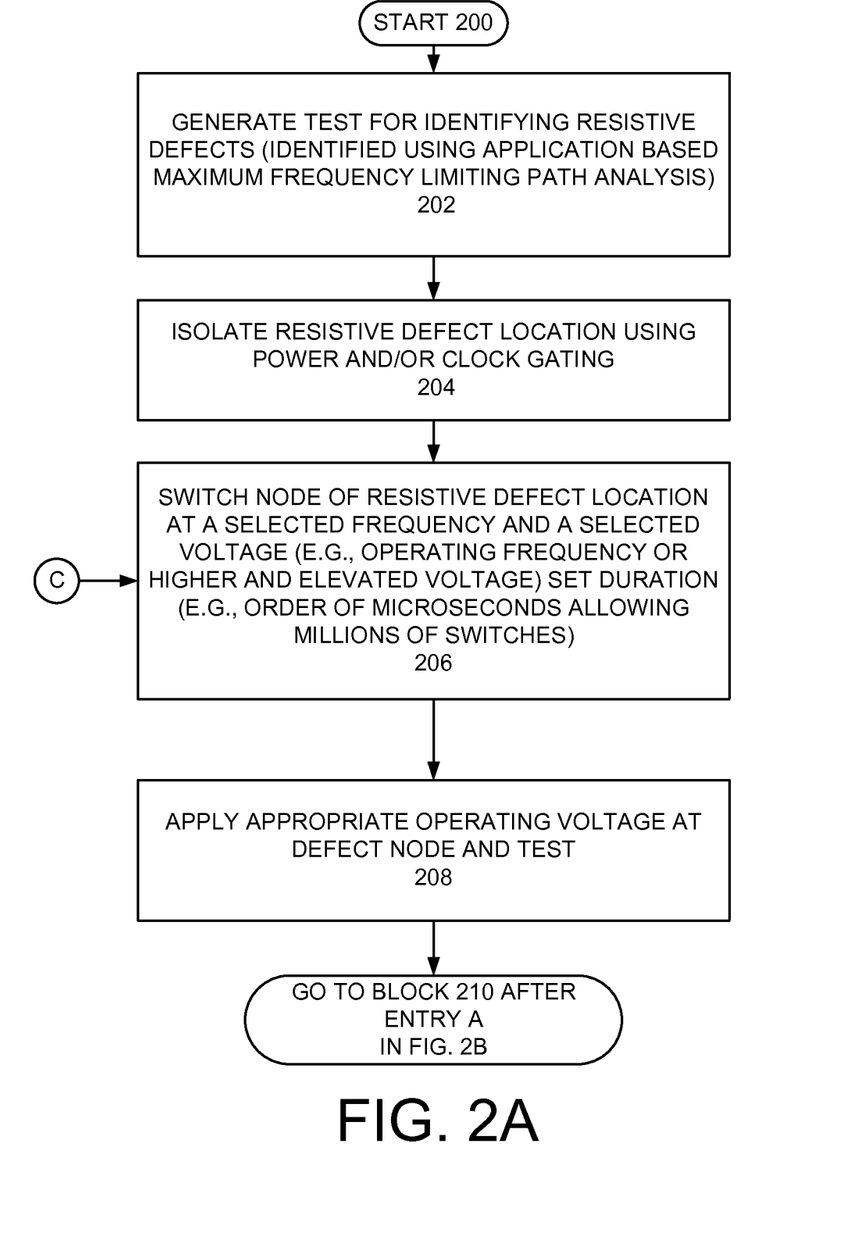
FIGS. 2A, 2B, and 2C are flow charts illustrating example steps for implementing resistance defect performance mitigation for integrated circuits using test signature directed self heating and increased voltage in accordance with preferred embodiments.
Figure 2B:
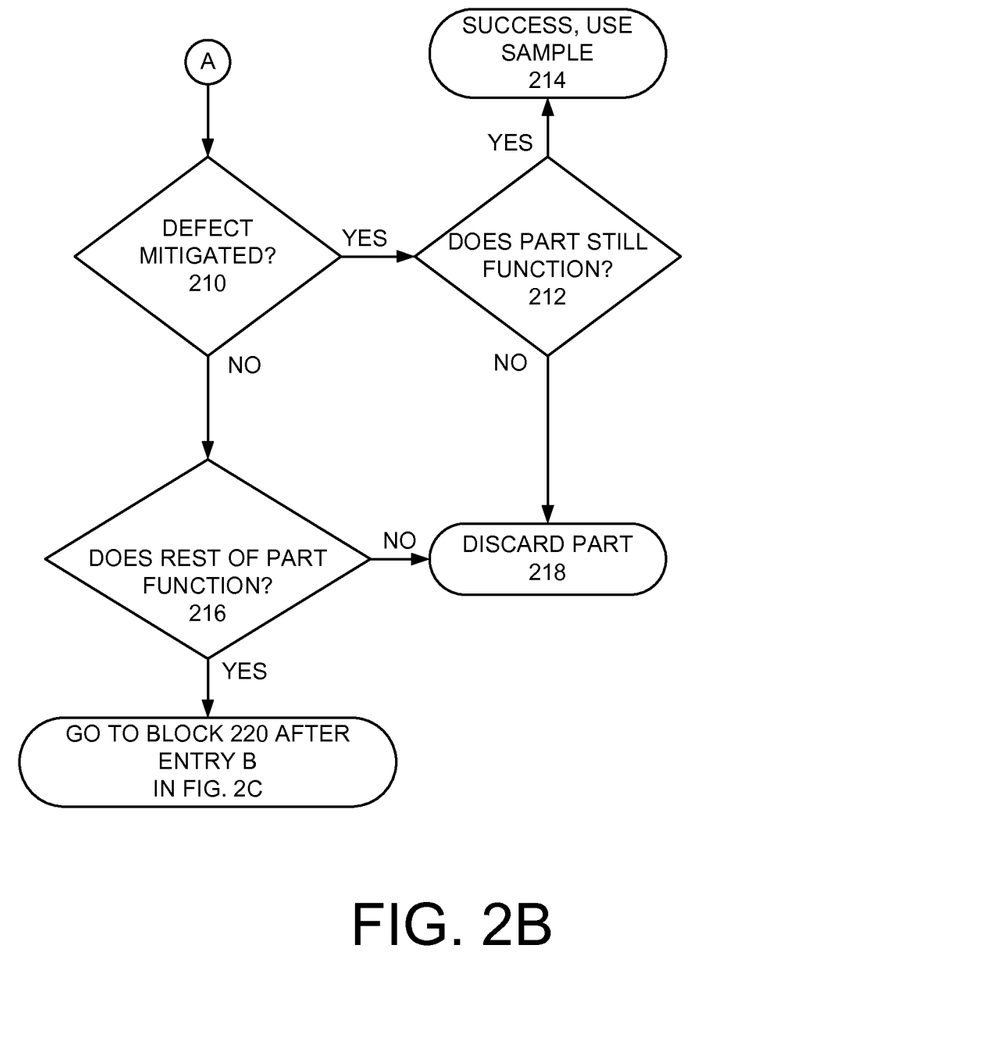
Figure 2C:
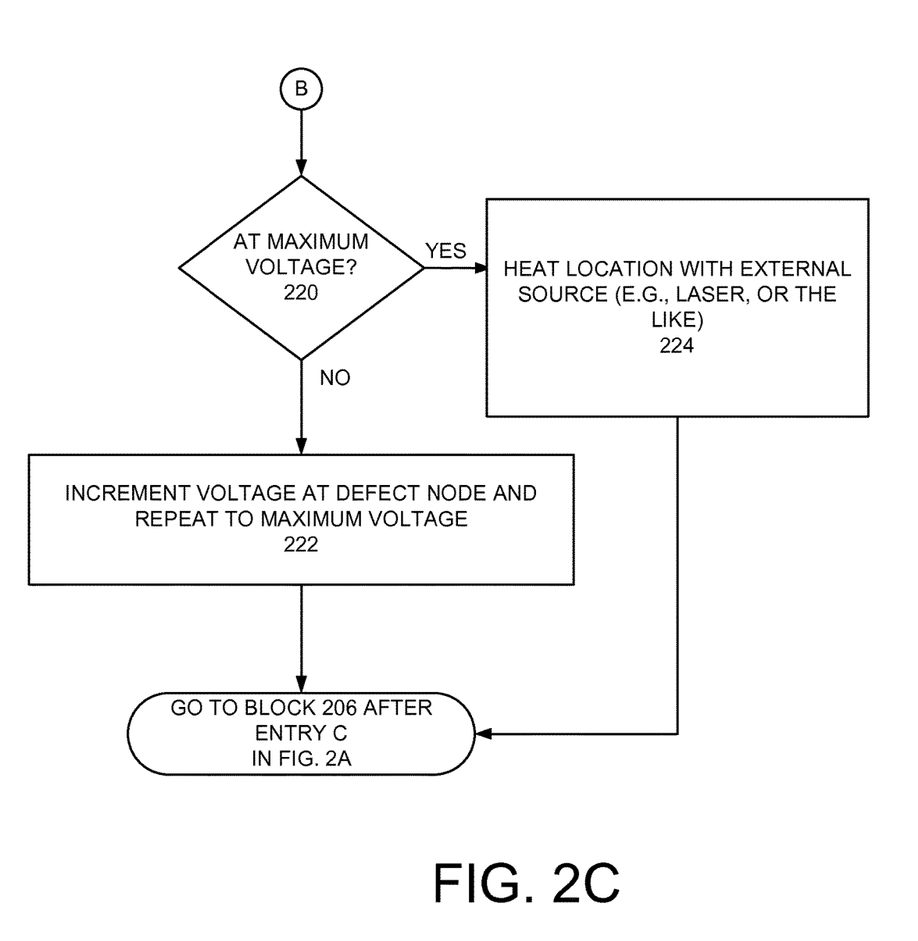

Referring now to FIGS. 2A, 2B, and 2C, there are show flow charts illustrating example steps for implementing resistance defect performance mitigation for integrated circuits using test signature directed self heating and increased voltage in accordance with preferred embodiments. In FIG. 2A, example steps start as indicated in a block 200. As indicated in a block 202, a test is generated for identifying resistive defects. An identified resistive defect location is isolated using power and/or clock gating as indicated in a block 204. As indicated in a block 206, a first self heating repair process is performed for repairing resistive defects. For example, switching a node of the resistive defect location at a selected frequency and a selected voltage for a set duration is performed at block 206. The selected frequency is, for example, at or perhaps slightly above a maximum frequency at which the integrated circuit will function for a duration on the order of microseconds allowing millions of switches. The repeated switching at block 206 nominally is done at an elevated voltage to enhance the amount of localized heating and stressing of any residual dielectric films in the connecting area.

As indicated in a block 208, an appropriate voltage for use is applied to the defect node, and testing is performed to identify a mitigated resistive defect and a functional integrated circuit. Operations continue at a decision block 210 in FIG. 2B following entry point A.

In FIG. 2B, checking is performed to identify a mitigated defect as indicated in a decision block 210. When a mitigated defect is identified, checking is performed to identify if the part still functions as indicated in a decision block 210. When a functional integrated circuit is identified, a successful repair is identified and the integrated circuit is passed for use. When a mitigated defect is not identified, checking is performed to identify if the part still functions as indicated in a decision block 216. Responsive to identifying a resistive defect being mitigated or not mitigated, when a functional integrated circuit is not identified, the integrated circuit is discarded as indicated in a block 218. Operations continue at a decision block 220 in FIG. 2C following entry point B.

In FIG. 2C, when a functional integrated circuit is identified, checking is performed to identify if at a maximum voltage as indicated in a decision block 220. If not at the maximum voltage, the voltage is incremented by a set step as indicated in a block 222 and operations continue at decision block 206 in FIG. 2A following entry point C. Until the defect is mitigated, incrementing the voltage by the set step is repeated until the maximum voltage is provided at block 222. When the maximum voltage is identified at decision block 220, the defect location is heated with an external source, such as a laser or the like, as indicated in a block 224 and operations continue at decision block 206 in FIG. 2A following entry point C.

Figure 3:
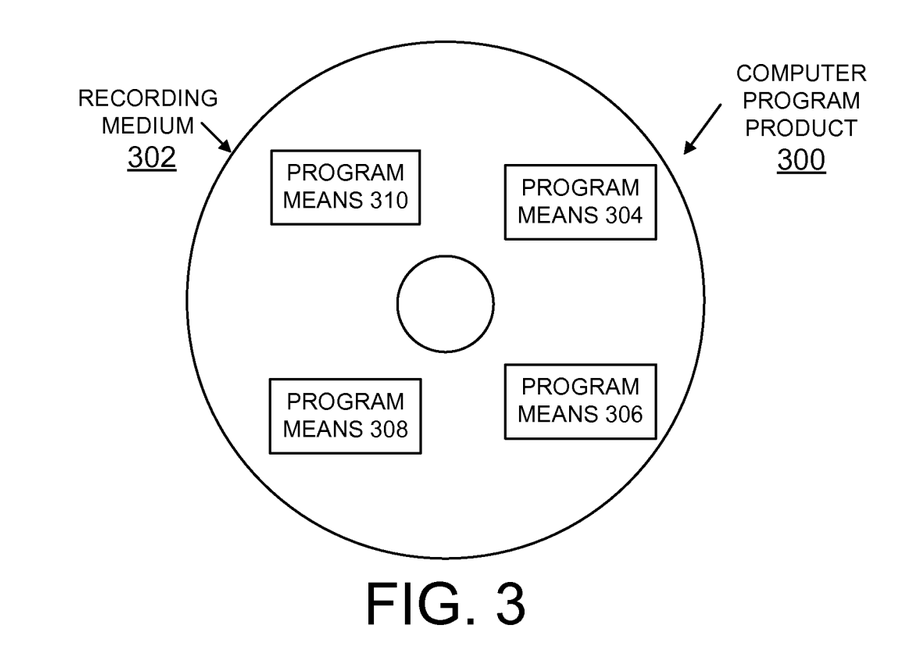
FIG. 3 is a block diagram illustrating a computer program product in accordance with the preferred embodiment.

Referring now to FIG. 3, an article of manufacture or a computer program product 300 of the invention is illustrated. The computer program product 300 is tangibly embodied on a non-transitory computer readable storage medium that includes a recording medium 302, such as, a floppy disk, a high capacity read only memory in the form of an optically read compact disk or CD-ROM, a tape, or another similar computer program product. Recording medium 302 stores program means 304, 306, 308, and 310 on the medium 302 for carrying out the methods for implementing resistive defect performance mitigation for integrated circuits using test signature directed self heating and increased voltage in system 100 of FIG. 1.

A sequence of program instructions or a logical assembly of one or more interrelated modules defined by the recorded program means 304, 306, 308, and 310, direct the computer system 100 for implementing resistive defect performance mitigation for integrated circuits using test signature directed self heating and increased voltage in accordance with the preferred embodiments.

While the present invention has been described with reference to the details of the embodiments of the invention shown in the drawing, these details are not intended to limit the scope of the invention as claimed in the appended claims.

What is claimed is:

1. A computer system for implementing resistive defect performance mitigation for integrated circuits comprising:
   a processor;
   a test generator;
   a resistive defect performance mitigation control;
   said processor using said test generator and said resistive defect performance mitigation control to implement resistive defect performance mitigation for a sample integrated circuits;
   said processor using said test generator for identifying resistive defects;
   said processor using said resistive defect performance mitigation control for performing a first self heating repair process for repairing resistive defects;
   said processor using said test generator for performing testing to identify a mitigated resistive defect and a functional integrated circuit; and
   said processor using said resistive defect performance mitigation control responsive to identifying a resistive defect not being mitigated and a functional integrated circuit, for performing a second repair process, and repeating testing to identify a mitigated resistive defect and a functional integrated circuit.

2. The system as recited in claim 1 includes control code stored on a computer readable medium, and wherein said processor uses said control code for implementing resistive defect performance mitigation for integrated circuits.

3. The system as recited in claim 1 wherein the first self heating repair process includes repeatedly switching a signal to a circuit path containing the resistive defect at a selected frequency and a selected voltage for a set duration.

4. The system as recited in claim 3 wherein said selected frequency is approximately equal or slightly above a maximum frequency at which the integrated circuit functions, and said set duration equals a set number of microseconds allowing millions of switches.

5. The system as recited in claim 3 wherein the repeated switching is provided at a set elevated voltage to enhance localized heating and stressing of any residual dielectric films in the connecting area.

6. The system as recited in claim 1 wherein repairing resistive defects includes one or more of repairing resistive connections in a contact, a via, and a high resistance defect present in an internally embedded interconnect.

7. The system as recited in claim 1 wherein performing testing to identify a mitigated resistive defect and a functional integrated circuit includes said processor using said resistive defect performance mitigation control, applying an appropriate voltage for use of the integrated circuit to a defect node, and testing to identify a mitigated resistive defect and a functional integrated circuit.

8. The system as recited in claim 1 wherein said second repair process includes said processor using said resistive defect performance mitigation control, using a laser to enhance the local heating.

9. The system as recited in claim 1 wherein said second repair process includes said processor using said resistive defect performance mitigation control, providing incremental voltage steps to a defect node and repeating until a mitigated resistive defect is identified or a maximum voltage is reached.

10. The system as recited in claim 1 includes said processor using said resistive defect performance mitigation control, identifying a successful repair, responsive to identifying a resistive defect being mitigated and a functional integrated circuit being identified.

11. The system as recited in claim 1 includes said processor using said resistive defect performance mitigation control, discarding the integrated circuit, responsive to a functional integrated circuit not being identified.

\* \* \* \* \*